United States Patent [19]

Gill et al.

[11] Patent Number: 4,974,390
[45] Date of Patent: Dec. 4, 1990

[54] SYSTEM AND METHOD FOR LOADING ELECTRONIC COMPONENT CARRIER TUBES

[75] Inventors: Elmer J. Gill, Austin; Ronald E. Hunt, Georgetown; Verlon E. Whitehead, Austin, all of Tex.

[73] Assignee: International Business Machines Corporation, Armonk, N.Y.

[21] Appl. No.: 347,691

[22] Filed: May 5, 1989

[51] Int. Cl.$^5$ .......................... B65B 5/08; B65B 19/34
[52] U.S. Cl. .......................... 53/444; 53/446; 53/447; 53/475; 53/148; 53/540; 53/544
[58] Field of Search .................... 53/525, 475, 544, 54, 53/540, 244, 247, 258, 448, 444, 446, 475, 148; 198/391

[56] References Cited

U.S. PATENT DOCUMENTS

| | | | |
|---|---|---|---|
| 2,935,830 | 5/1960 | Collins et al. | 53/525 X |
| 3,063,213 | 11/1962 | Goran, Jr. | 53/244 |
| 3,662,881 | 5/1972 | Fineran | 53/244 X |
| 3,940,908 | 3/1976 | Dazen et al. | 53/525 X |
| 3,965,648 | 6/1976 | Tedesco | 53/244 X |
| 3,986,636 | 10/1976 | Hoppmann et al. | 53/475 X |
| 4,010,596 | 3/1977 | Osterholt | 53/244 X |
| 4,802,325 | 2/1989 | Duncan | 53/475 X |
| 4,842,808 | 6/1989 | Rieben et al. | 53/244 X |

Primary Examiner—Horace M. Culver
Attorney, Agent, or Firm—Robert M. Carwell

[57] ABSTRACT

A queing means transfers surface mount components randomly stored in a detachable hopper into a plurality of parallel lines formed by grooves in a track plate. Vibrator means translate the components along the grooves in the downwardly extending track plate toward a shuttle assembly. With respect to pairs of such track grooves, the shuttle assembly alternately transports a chip from each groove comprising the pair into a plunger assembly. A tube magazine carrying a plurality of carrier tubes to be loaded with components is releasably disposed adjacent the plunger assembly whereby periodic downward movement of plungers simultaneously forces a component from each line of components in the plunger assembly formed by the shuttle mechanism into a respective one of the tubes, and the process is repeated until the tubes are filled with components as desired. Pneumatic means are provided for urging the components backwards from the plunger assembly along the grooves toward and into the hopper. The apparatus is thereby purged in preparation for substitution of a next hopper containing different components and a set of tubes carried by a next tube magazine replacing the one carrying the thus-filled tubes.

23 Claims, 17 Drawing Sheets

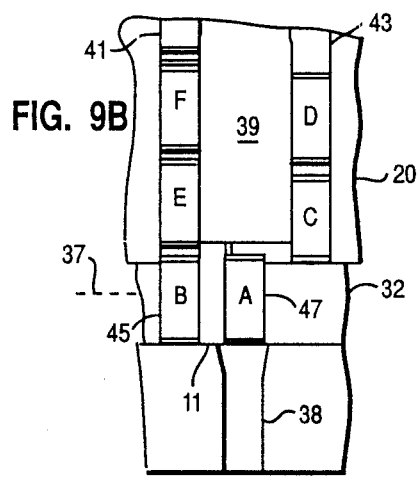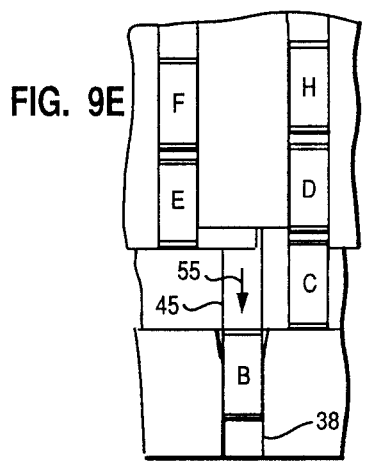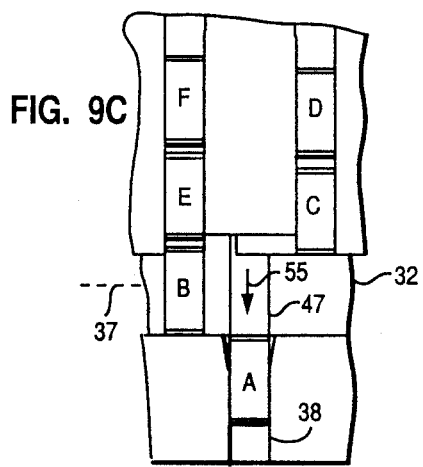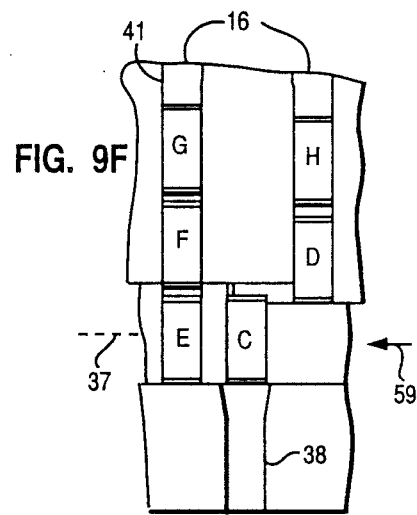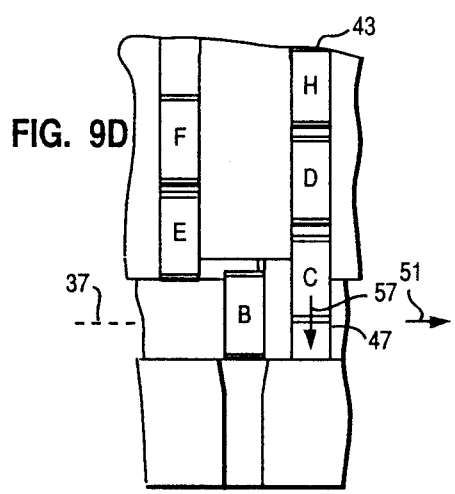

SYSTEM AND METHOD FOR LOADING ELECTRONIC COMPONENT CARRIER TUBES

TECHNICAL FIELD

This invention relates to automated electronic component placement machines and, more particularly, relates to methods and apparatus for loading electronic components into tubes employed by such machines.

BACKGROUND ART

In the evolution of modern electronic manufacturing art the long established trend has been toward smaller components and more dense packaging made possible by these components and development of sophisticated circuitizing techniques employing laser technology and the like. Yet an additional trend in order to continue favorable improvements in manufacturing cost reductions has been away from hand work and toward increasingly sophisticated automated assembly techniques. Representative of this are automatic component placement machines such as those depicted in U.S. Pat. No. 4,135,630 and machines such as those manufactured by the Dynapert Corporation, Universal Instruments Company, and Panasonic. These machines employ robotics-type techniques to automatically place various pin-in-hole, surface mount or other components, on substrates or circuit boards as desired.

Whereas the current state of the art with respect to such automated placement devices is predominantly of the type wherein single components are place sequentially, effort is currently being made to advance the art further by means of machines capable of placing a plurality of components simultaneously. One example of such a machine is provided by Panasonic National, details of a representative system thereof being set forth in a publication entitled "Specifications: Panasert Simultaneous Chip Component Placement Machine Model No. NM-8270". As the art continues to develop, tremendous manufacturing throughput capability thereby results wherein it becomes possible to place large numbers of components on boards at extremely rapid rates.

One very serious problem with such tremendous throughput is in feeding components to the machines for automated placement in a form which may readily be used by the particular machine. One technique for attempting to solve the problem has been to place the components on a tape for tape feeding. However with the advent of simultaneous component placement equipment and the increasingly smaller dimensions of the various components, techniques such as those disclosed in the aforementioned Panasonic machine are beginning to be employed wherein components are loaded or stacked vertically in carrier tubes for use by the machines.

Notwithstanding improved packaging techniques for storing components and delivering them to the machines such as the tubes just mentioned, a serious problem remains in how to package such components in tubes in a rapid, economical and yet reliable fashion. The urgent need for a quick and efficient means to effect such packaging may be understood when it is considered that with the increasing costs of such sophisticated placement machinery, down time while awaiting a supply of appropriately configured chips is prohibitively expensive and unacceptable.

However, lack of available equipment for quickly, economically and reliably loading tubes with increasingly smaller and smaller components has seriously impeded progress toward adoption of simultaneous placement and other techniques for substantially improving manufacturing throughput. Numerous difficult problems are associated with providing such tube loading machinery which are not readily apparent. First, due to the extremely minute size of such components placing hundreds of such minute components in a tube in a uniform orientation is non-trivial. With respect to the components themselves, for example, the industry has been plagued with inability to consistently align such small components repeatedly due to innumerable factors including the tendency of components to stick together, and chip dimensional variations arising from non-uniformity in manufacture, broken components, and the like.

Reliably and consistency in placing a vast, uniform number of such minute components in exactly the same orientation within tubes and insuring the integrity of each such component is extremely important. This may be appreciated when it is considered that with the incredible throughput provided by simultaneous placement machines, numerous boards could be populated with chips which were defective or disoriented long before the error was detected in a manufacturing line. This results in extremely expensive waste material or rework cost. Such errors could be caused not only by broken chips loaded into the tubes, but even in some instances by inverted chips having contact pads on only one side which must be consistently loaded with these pads oriented in the same way.

Yet another example of the need for 100% accuracy in tube loading is that with dissimilar numbers of components in the various tubes used on a placement machine, numerous boards could be populated with missing components due to tubes having a substandard number of such components running out of chips prior to the other tubes.

One attempt to provide an automated chip loading machine employs a vibratory bowl technique used in the handling of small parts such as screws or the like. In operation this machine provides a helical path down which chips are vibrated from a reservoir until they are somewhat uniformly aligned for subsequent placement in a tube. Numerous drawbacks to such an approach result in the industry still being in need of an effective solution to the component tube filling problem. One serious and immediately apparent drawback is that the machine is adapted to only load single tubes at a time. A large number of such expensive machines is thereby necessitated to hope to even attempt to keep up with the vastly increasing throughput of simultaneous component placement machines as aforesaid. Yet additional serious drawbacks of this machine include lack of visibility of the loading process, difficulty in purging the machine and changeover to begin loading a different component, and failure to provide for detection of dimensional or functional irregularities in the chips.

With the foregoing in mind, it is apparent that a component tube loading machine was desperately needed in the industry which could provide for the consistent loading of various components in tubes wherein the machine was extremely reliable and, had a substantial throughput to enable the tube filling task to keep pace with the throughput of placement machines. Such a machine was also urgently needed which could provide for the loading of a plurality of tubes simultaneously, and which further provided for ease of purging when it was desired to fill tubes with a different component. Still further a component loader was sought which provided ease of visibility of the progress of the components during the loading process, and which further prevented loading tubes with non-uniform components. Yet further features desirable in such a machine were the ability to rapidly change over so as to begin filling another set of tubes and to further do so with a completely different component. These and other desirable features are provided by the subject invention which overcomes the hereinbefore described problems of the prior art.

SUMMARY OF THE INVENTION

A queing means transfers surface mount components randomly stored in a detachable hopper into a plurality of parallel lines formed by grooves in a track plate. Vibrator means translate the components along the grooves in the downwardly extending track plate toward a shuttle assembly. With respect to pairs of such track grooves, the shuttle assembly alternately transports a chip from each groove comprising the pair into a plunger assembly. A tube magazine carrying a plurality of carrier tubes to be loaded with components is releasably disposed adjacent the plunger assembly whereby periodic downward movement of plungers simultaneously forces a component from each line of components in the plunger assembly formed by the shuttle mechanism into a respective one of the tubes, and the process is repeated until the tubes are filled with components as desired. Pneumatic means are provided for urging the components backwards from the plunger assembly along the grooves toward and into the hopper. The apparatus is thereby purged in preparation for substitution of a next hopper containing different components and a set of tubes carried by a next tube magazine replacing the one carrying the thus-filled tubes.

BRIEF DESCRIPTION OF THE DRAWING

The novel features believed to be characteristic of the invention are set forth in the appended claims. The invention itself, however, as well as other features and advantages thereof, will be best understood by reference to the following description of the preferred embodiment, when read in conjunction with the accompanying figures, wherein:

FIGS. 9b-9f are schematic illustrations of the sequential operation of the shuttle plate of FIG. 6;

DETAILED DESCRIPTION OF THE PREFERRED EMBODIMENT

In order to provide a clear description of the structure and operation of the component loader of the present invention, first the overall sequence of operation of the apparatus will be discussed with reference to only those components necessary for a general understanding of such operation. This will be followed by a more detailed description of the various components and their manner of operation.

Figure 1A:
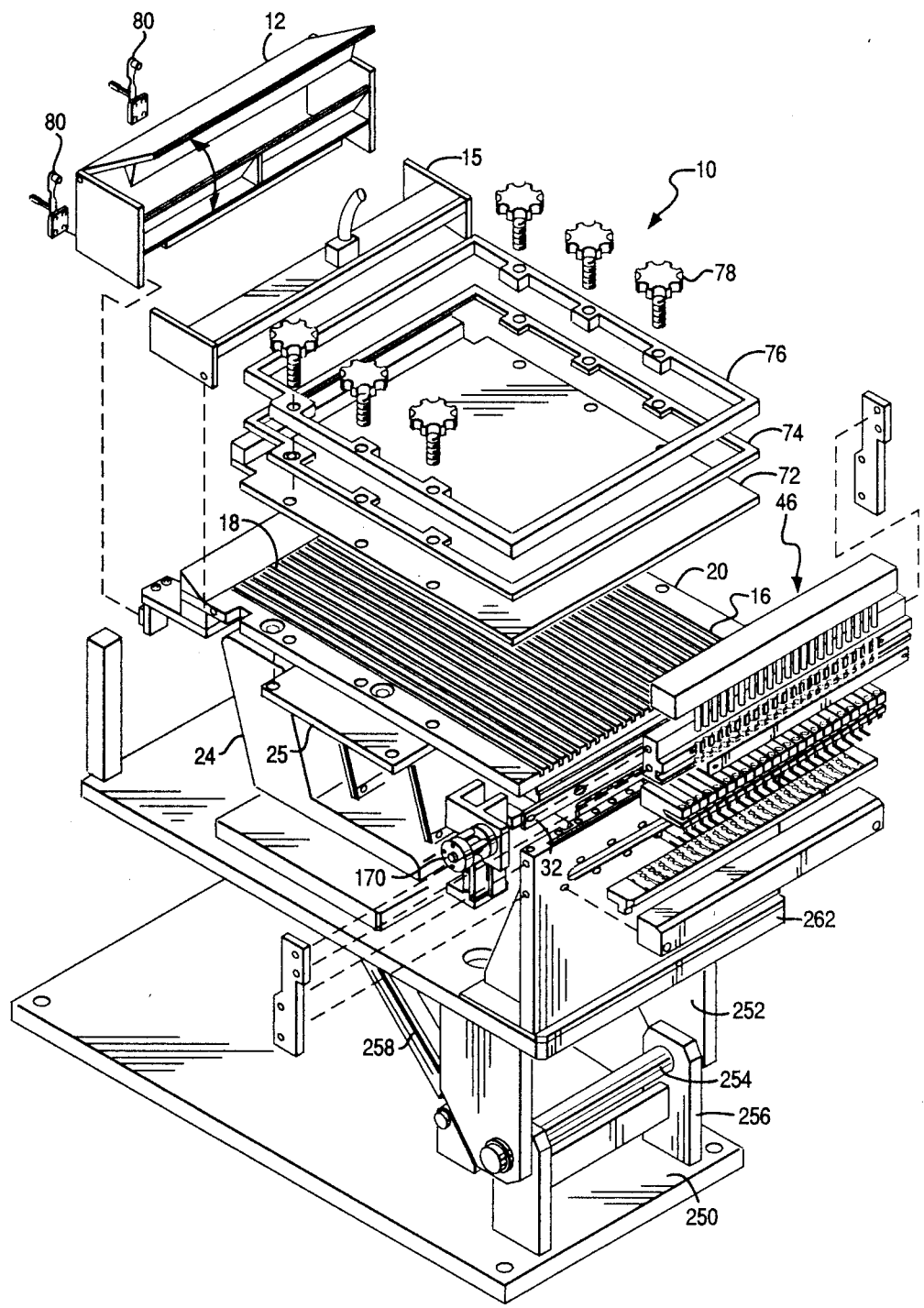
FIG. 1a is an exploded pictorial view of the component loader of the present invention.

First with reference to FIG. 1a, the component loader apparatus 10 of the invention may be seen depicted therein in an exploded pictorial form. It will be recalled that the general purpose of such apparatus is to provide an automated means for loading large quantities of various electronic components such as surface mount resistor and capacitor chips from a hopper 12 into a plurality of tubes 13, FIG. 11. The tubes preferably are releasably carried by a tube carrier magazine 14 which, in turn, is releasably attachable at the rightmost end of the loader 10 adjacent a plunger assembly 46, FIG. 1.

Figure 5:
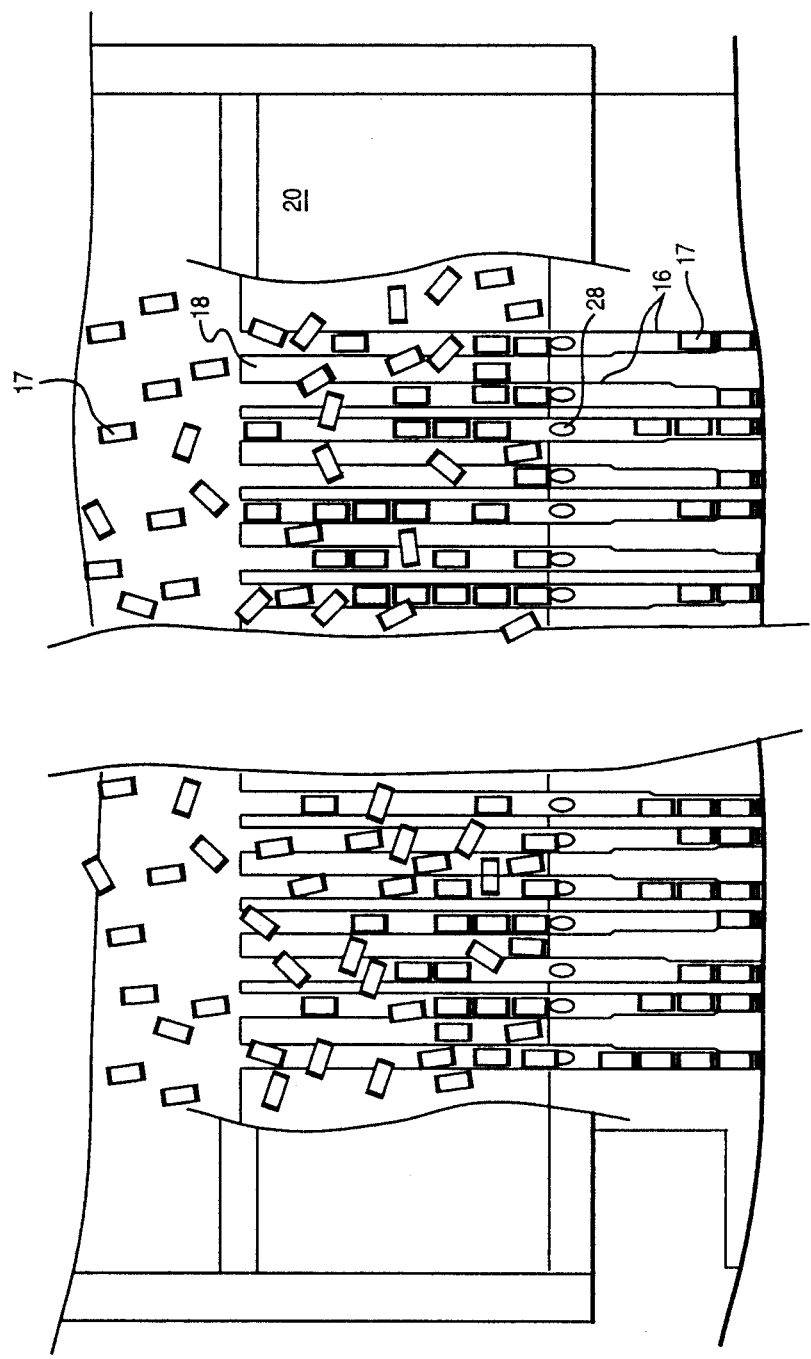
FIG. 5 is a top plan view of the upper portion of the component loader of FIG. 1 partly in section depicting the alignment of chips from the separator box through the throat into the tracks of the track plate.

In terms of overall operation, a track plate 20 is mounted on a vibrator 24 which in turn is disposed on a mounting plate 25 whereby controlled vibration of the vibrator 24 is thereby imparted to the track plate 20. A more detailed reference to the track plate in FIG. 1 and the accompanying FIG. 9a will indicate that on upper surface thereof is disposed a plurality of pairs of groove-like open tracks 16 having widths corresponding to the widths of the chips 17, FIG. 5, to be loaded into the tubes 13 in vertical registry. Upon movement of such chips from the hopper 12 through a separator box 15, FIGS. 1 and 2 toward the upper portion of the track plate 20 where the open tracks 16 commence (in a manner to be detailed hereinafter), the chips 17 are thereby caused to align themselves by the vibrations into the tracks 16 as shown in FIG. 5.

Figure 1B:
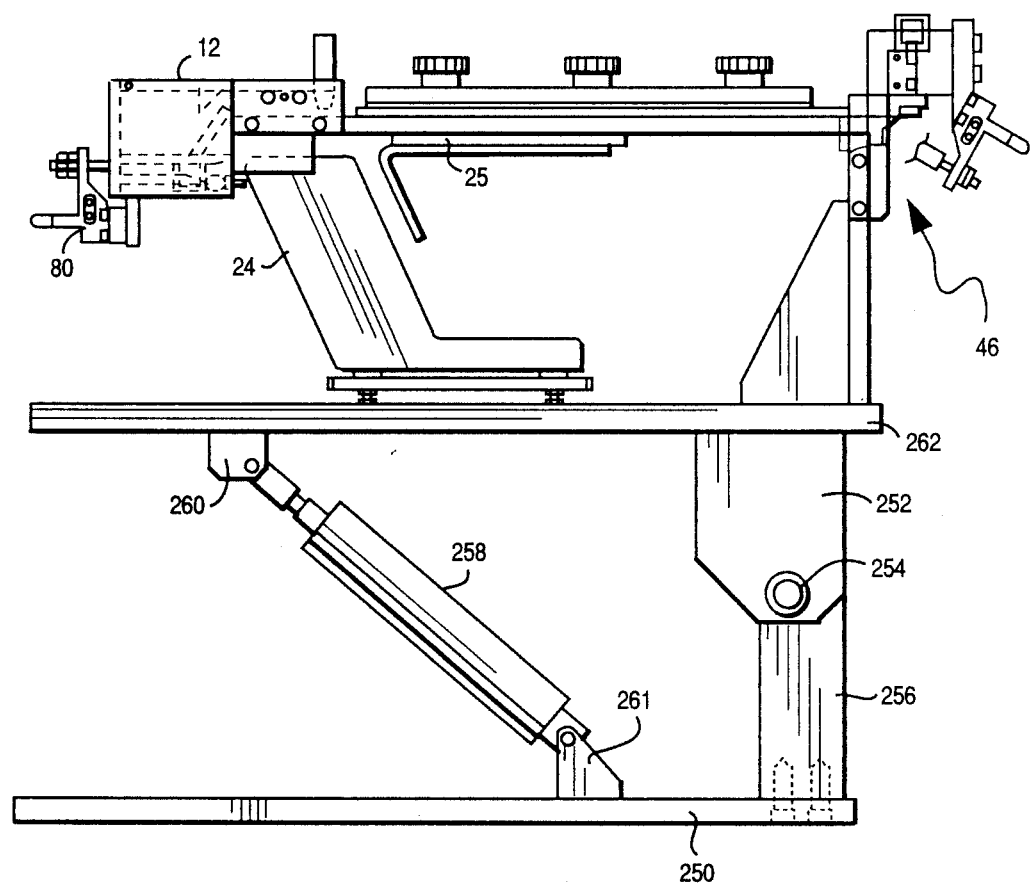
FIG. 1b is a simplified elevational side view of the loader of FIG. 1a in a first operational state.
Figure 1C:
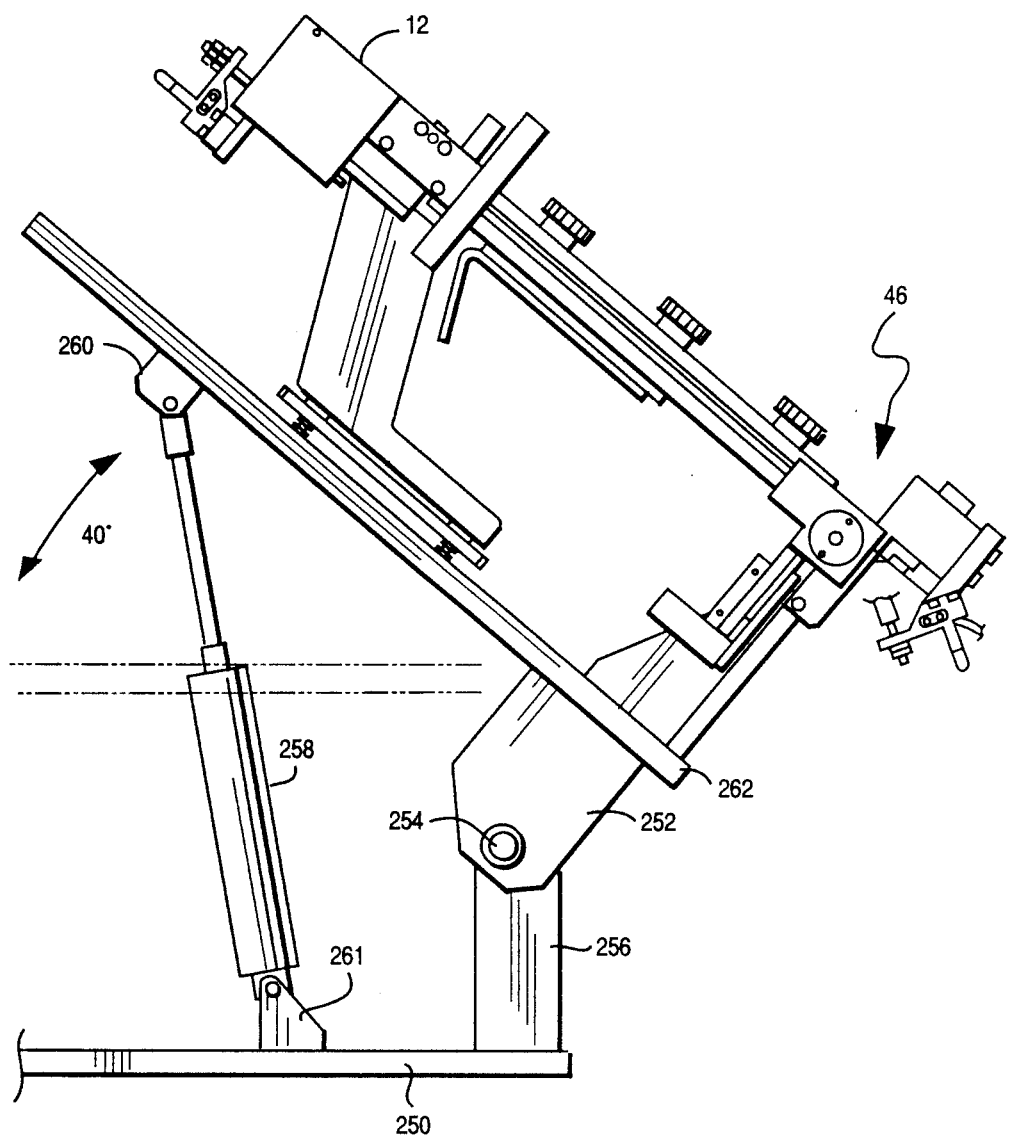
FIG. 1c is another simplified elevational side view of the loader of FIG. 1a in a second operational state.

During the tube loading procedure the mounting plate 25 and thus the track plate 20 are disposed at a 40° angle with respect to the horizontal as shown in FIG. 1c whereby upon continued operation of the vibrator 24 and as a result of vibrations thereby imparted to the track plate 20, the chips 17 continue to move in lines along the tracks 16 downwardly toward the plunger assembly 46.

Figure 9A:
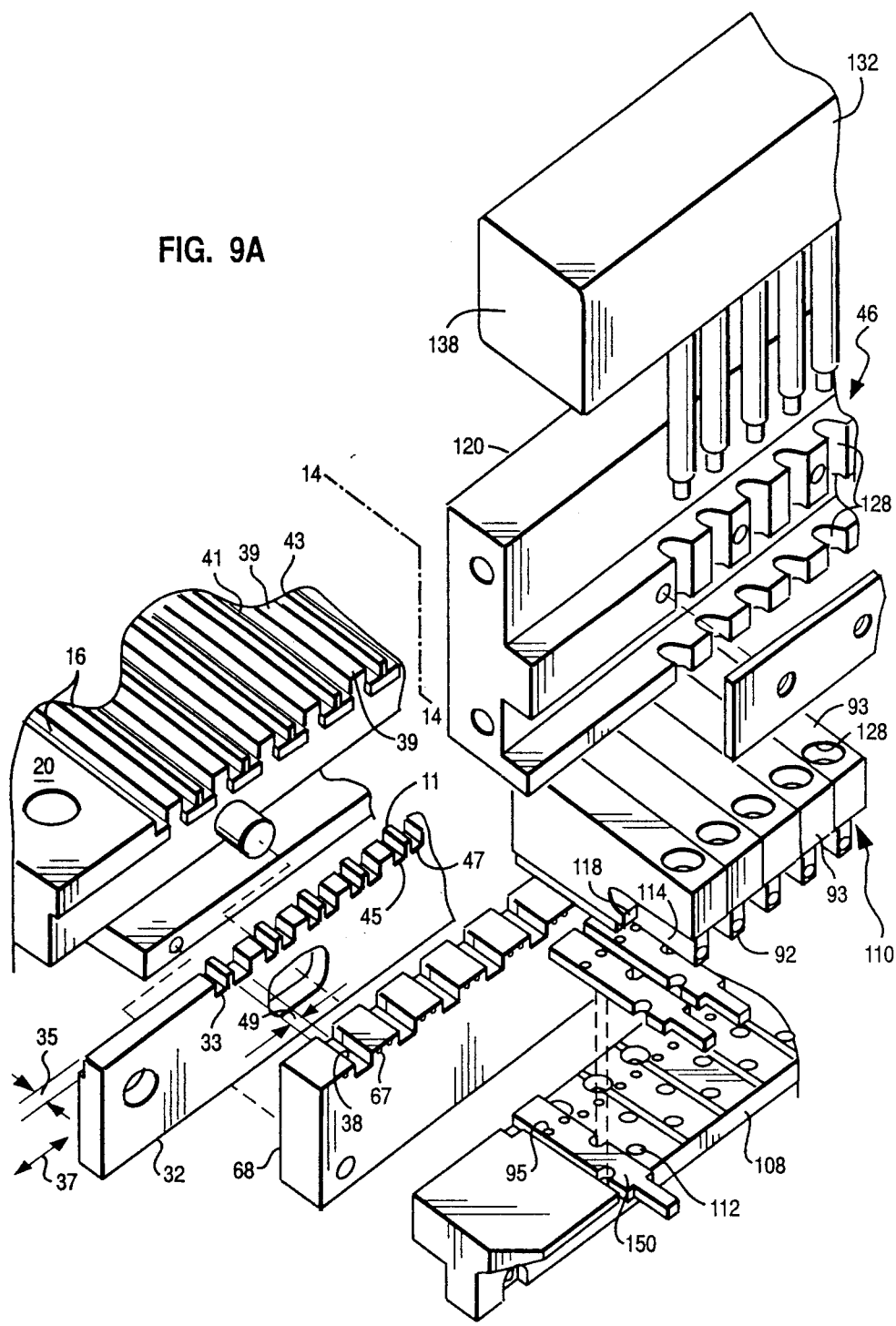
FIG. 9a is a pictorial view partially in section depicting the plunger assembly of FIG. 1.
Figure 10:
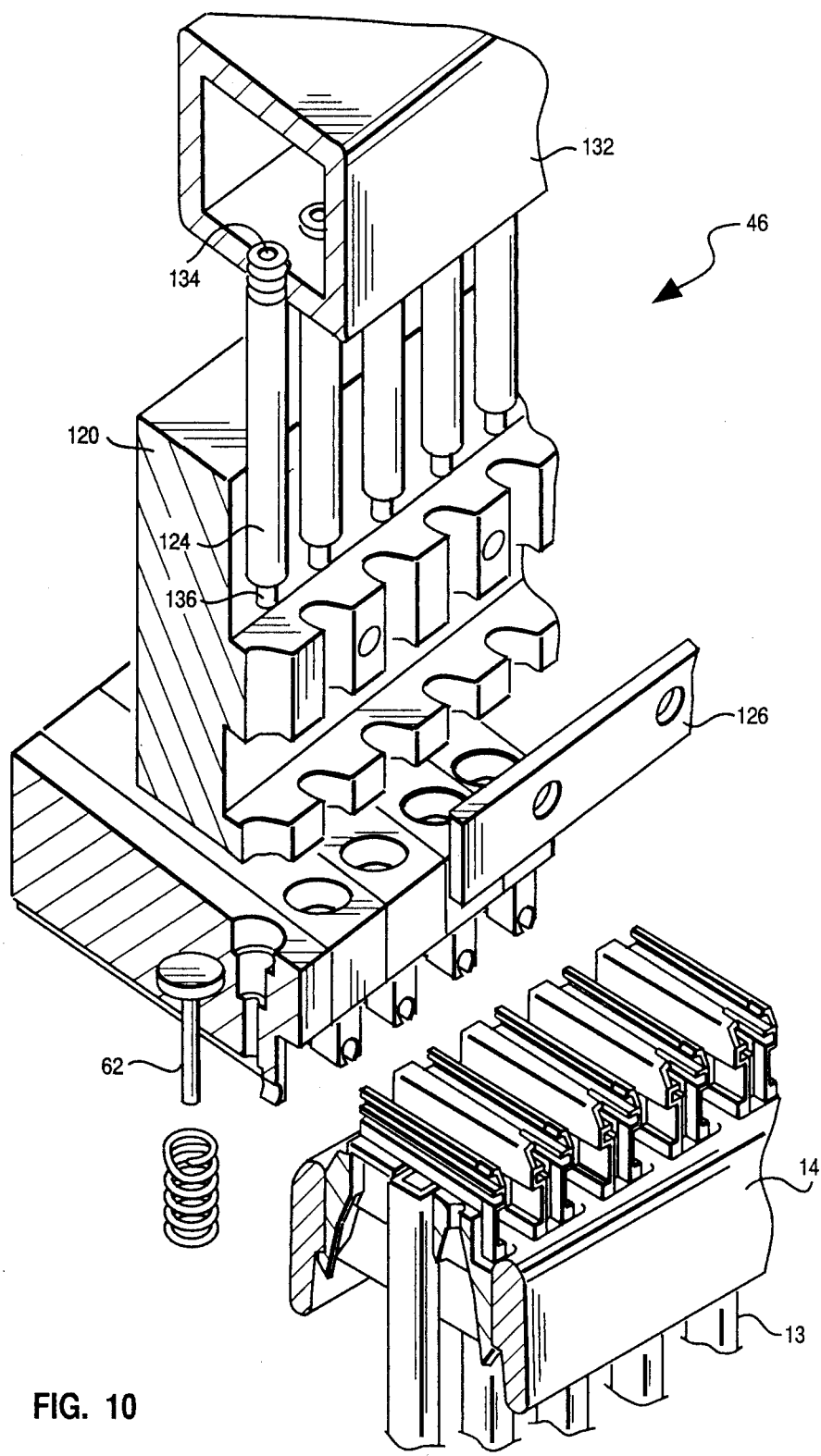
FIG. 10 is another exploded pictorial view of the plunger assembly of FIG. 9.

A pair of tracks 16, FIG. 1, is provided for each tube 13 to be loaded. A shuttle 32, FIGS. 1 and 9a, includes a plurality of slots 33 disposed on the upper surface thereof having a slot length 35 approximately equal to the length of each chip, and a slot width 49 approximately equal to the width of each chip. With reference to FIG. 9a, a track separator 39 portion of the upper surface of the track plate 20, with respect to each track pair defines a first track 41 on one side of each track separator 39 and a second track 43 on the other side of the given track separator 39. In like manner with respect to each pair of slots 33 in the shuttle 32, a slot separator 11 defines a first slot 45 on the left side of the separator 11 and a second slot 47 on the right side of the separator 43.

Means are provided for urging the shuttle 32 alternately in both directions along the axis 37 for purposes which will become clear now with reference to FIGS. 9b-9f. These figures depict a simplified illustration of how chips are alternately selected from differing tracks of each track pair by the shuttle 32 and disposed in the funnel track 38 FIG. 6, for subsequent loading into a tube 13 corresponding to each funnel track. In FIG. 9b chips E and F have been aligned in the first track 41 and have progressed generally downwards towards the shuttle 32 by the previously described vibratory action. A chip B has further progressed into the first slot 45 in like manner. Due to prior positioning of the shuttle 32 with the second slot 47 in line with the second track 43, a chip A has previously been displaced into the second slot 47 of the shuttle 32 and the chips D and C, again by vibratory action, have been disposed within and have progressed along the second track 43 as shown.

With reference to FIG. 9c, the previously described vibratory action causes the chip A to exit the second slot 47 and travel generally in the direction of arrow 55 toward its respective funnel track 38, whereupon the shuttle 32 is thence urged along axis 37 in the direction of arrow head 51 into the position shown in FIG. 9d relative to track plate 20. As a result of this motion, as shown in FIG. 9d, chip B is thereby moved laterally into the position replacing that of chip A, chip C moves into the second slot 47 previously vacated by chip A as shown by arrow 57 with chip D moving into a position replacing chip C in the second track 43.

Referring to FIG. 9e, vibration and gravity causes chip B to exit first slot 45 as shown by arrow 55 in the direction of funnel track 38 in like manner to chip A which was previously ejected from second slot 47 as described with reference to FIGS. 9b-9c. Upon chip B exiting this first slot 45, the shuttle 32 is thereby urged again along axis 37 in the direction of arrow head 59 until it reaches the position of FIG. 9f corresponding to the initial position of FIG. 9b. At this point chip E moves into the first slot 45 vacated by the exiting chip B causing chips F and G in the first track 41 to move downwards as shown in FIG. 9f whereupon the process just described with reference to FIGS. 9b-9f is repeated. It will thus be appreciated from the foregoing that in order to increase throughput of the component loader 10 a pair of tracks 16 is provided for each funnel track 38 and corresponding tube 13.

Figure 11:
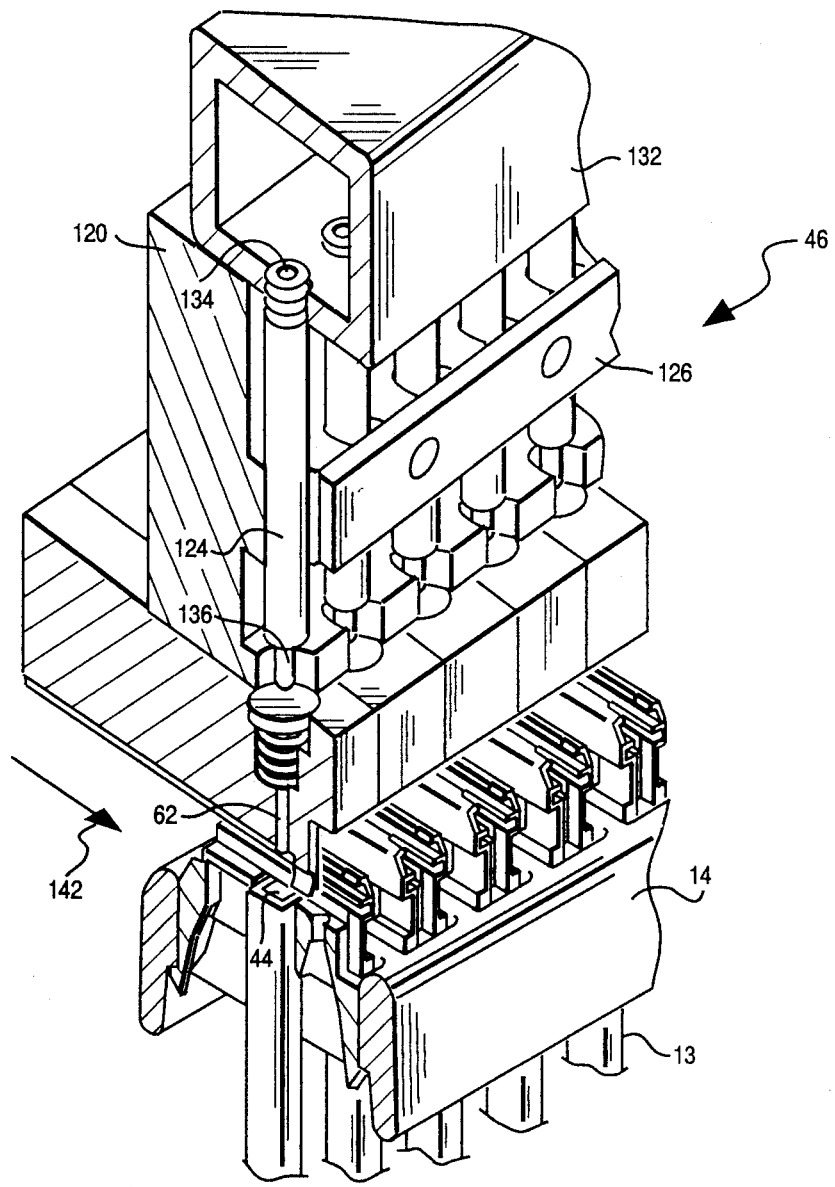
FIG. 11 is another pictorial view partly in section of the plunger assembly and tube carrier magazine prior to chips being urged into the tubes by the plungers.
Figure 13:
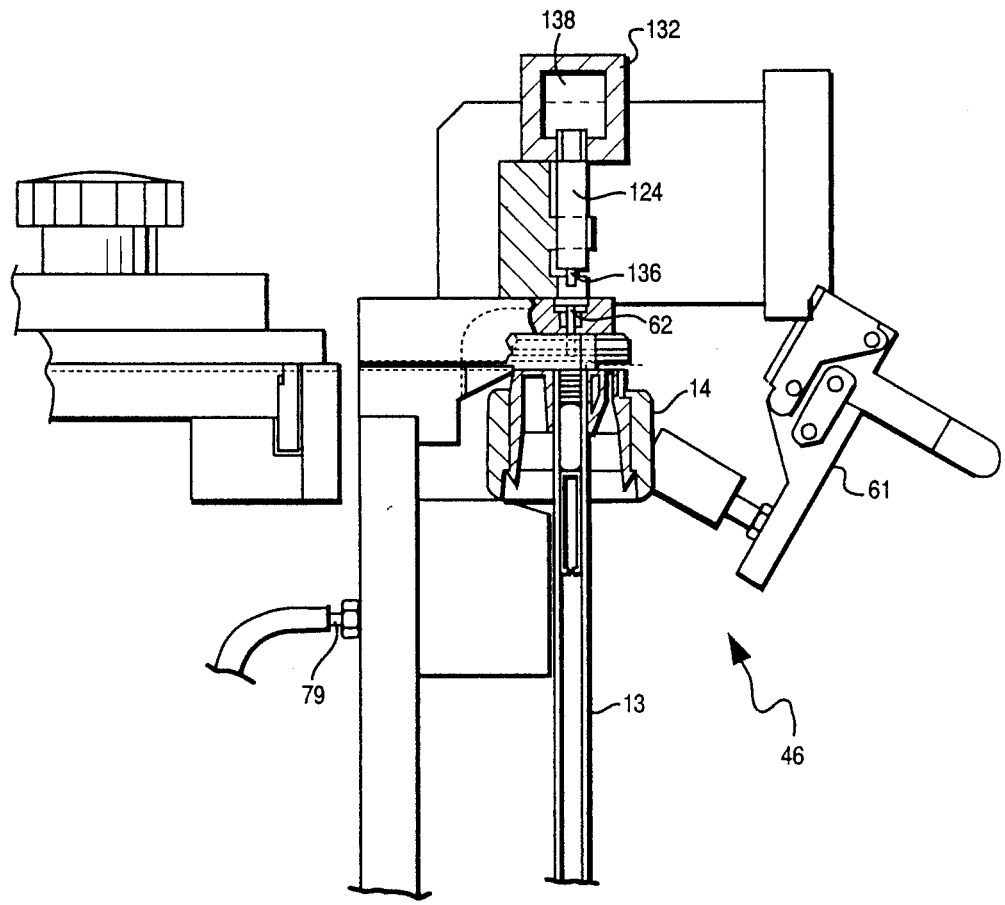
FIG. 13 is an elevational view partly in section of the rightmost end of the component loader of FIG. 1.

Now that a general description of the overall operation of the component loader 10 has been provided, more specific functional and operational features will be described prior to a more detailed description of the various components thereof. Referring to FIG. 11, as the tubes 13 carried by a given tube carrier magazine 14 are filled with chips as required, it is desirable to remove the magazine 14 from the loader 10 and replace it with a next magazine carrying empty tubes 13 whereby they may, in like manner, be filled by the loader 10. Accordingly, as shown in FIG. 13, a clamp assembly 61 which may take a number of convenient forms and include clamp assemblies readily available in the commercial market, is provided for releasably clamping each such magazine 14 so as to position the tubes 13 thereof in the position shown in FIG. 11 under respective plungers 62 of the plunger assembly 46.

Figure 12:
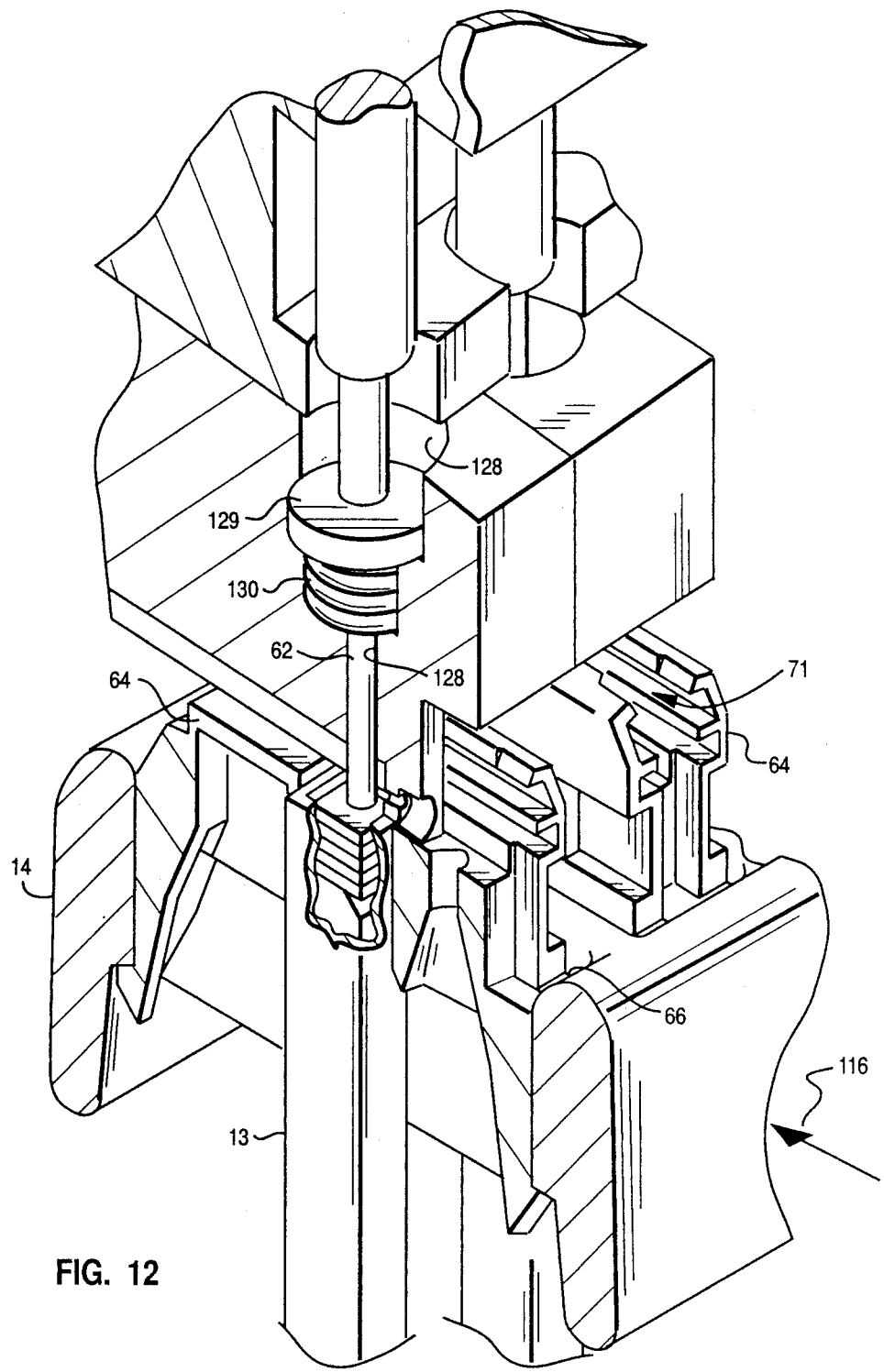
FIG. 12 is a pictorial view partly in section of the plunger assembly and tube carrier magazine after chips have been urged into the tubes by the plungers.

The tubes 13 may preferably be each disposed in a corresponding header block 64, FIG. 12, each such block 64 of which is press fit into a corresponding slot 66 of the magazine 14 and releasably held therein. The header block 64 is of a form readily adapted to be received by components of a simultaneous placement machine when the blocks 64 are disengaged from the magazine 14 and disposed on the placement machine. Details of this header block 64 may be seen with reference to co-pending patent application U.S. Ser. No. 07/353,295 entitled "Method and Apparatus for Positioning Components" which is herein incorporated by reference.

Figure 14:
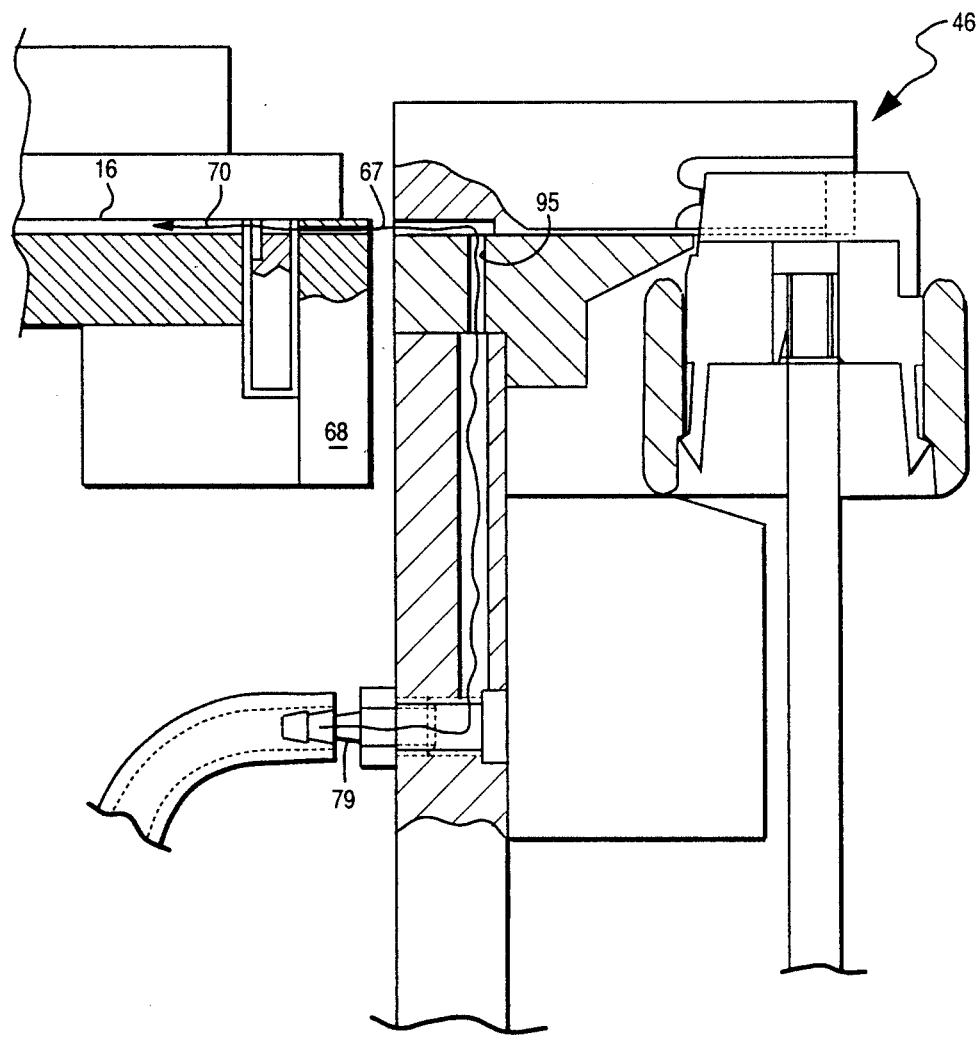
FIG. 14 is another elevational view partly in section of the plunger assembly indicating the flow path of air for purging the loader.

It will be appreciated that it is necessary to fill tubes with different types of chips and thus it would be highly desirable to easily purge the system of the loader 10 from all chips of a particular type and thence to set up the loader to commence loading chips of a next type into tubes of a subsequent magazine 14. Accordingly a brief description will now be provided of the means in loader 10 whereby this is accomplished. In FIGS. 9a and 14 which is a side elevation and cross-sectional view of the plunger assembly 46 taken along line 14—14 of FIG. 9a, a plurality of apertures 67 may be seen disposed in plate 68 which are aligned in registry with each of the tracks 16 of the track plate 20. Also in FIG. 14 is seen a passage way extending through the plunger assembly 46 so as to define a fluid circuit path shown by the arrow 70 through the plunger assembly 46, out the aperture, and through the track 16. Referring briefly back to FIG. 1a, a transparent cover 72 fashioned of plexiglass or the like is provided with a gasket 74, seal plate 76, and a plurality of screws 78. In assembly with the track plate 20, the cover 72 (by means of the screws 78 extending through the plate 76, gasket 74, cover 72 and into corresponding mating holes in the upper face of the track plate 20) cause this transparent cover 72 to be press fit across the top of the track plate 20, thereby sealing off the tops of the tracks 16 and forming them into rectangularly shaped elongate fluid passageways. In passing it will be noted that a benefit to this clear plastic cover 72 is that it permits monitoring of the progress of the chips during the loading operation.

Referring now again back to FIG. 14, by providing a source of pressurized fluid at nozzle 79 in the plunger assembly 46, fluid such as pressurized air is thereby caused to traverse the pneumatic circuit shown by arrow 70 forcing chips in the plunger assembly 46 in the direction of the arrow 70. Such pressurized fluid more-over causes chips disposed in each of the rectangular passageways formed by the tracks 16 and cover 72 along these tracks in a direction toward the separator box 15 shown in FIGS. 1a and 2. In the purging operation now under discussion, apertures 26 and 28, FIG. 4, in the separator box 15, FIG. 2, to be hereafter described, are desirably charged with pneumatic pressure but preferably in a continuous manner so as to assist the action of the fluid pressure exiting apertures 67, FIG. 9a, in causing chips moving into the separator box 15 to be urged therefrom into the hopper 12. When chips have thereby been purged from the plunger assembly 46, tracks 16, and separator box 15 into the hopper 12, the hopper 12 may thence be removed and replaced with a hopper containing a different type of chip to be loaded in tubes carried by a next magazine 14 subsequently attached to the plunger assembly 46. For this reason latches 80, FIG. 1a, which may be of any convenient form including commercially available latches are provided and attached to the loader 10 whereby each hopper 12 may be caused to releasably engage the loader 10 in the desired manner as shown in FIG. 2.

Referring now to more specific operations and features of the subject invention, with reference to FIG. 2 the manner in which chips are most effectively urged into the desired uniform alignment along the lines of the open tracks 16 will be described. The cavity 84 defined by hopper 12 is of sufficient size so as to serve as a reservoir for thousands of chips. However, it has been found that the combined means of vibratory action and agitation by pulsating pressurized fluid exiting apertures 26 and 28, FIGS. 2, 4 to be described, for effecting the desired uniform orientation of chips in the que tracks 18 is rendered more effective in terms of resultant throughput if an attempt is avoided to operate upon the entire contents of the hopper 12 in this manner. Accordingly, a mechanism and technique was sought for selectively controlling the number of chips subjected to this vibratory and throat-clearing pneumatic action relative to the varying number of chips which might be carried in the cavity 84 of the hopper 12. In other words, it was found desirable to restrict the number of chips within the separator box 15 undergoing this vibratory and pneumatic action within a range which, in turn, required some means for selectively introducing controlled quantities of chips into the cavity 86 of the separator box 15 from the cavity 84 of hopper 12.

Figure 2:
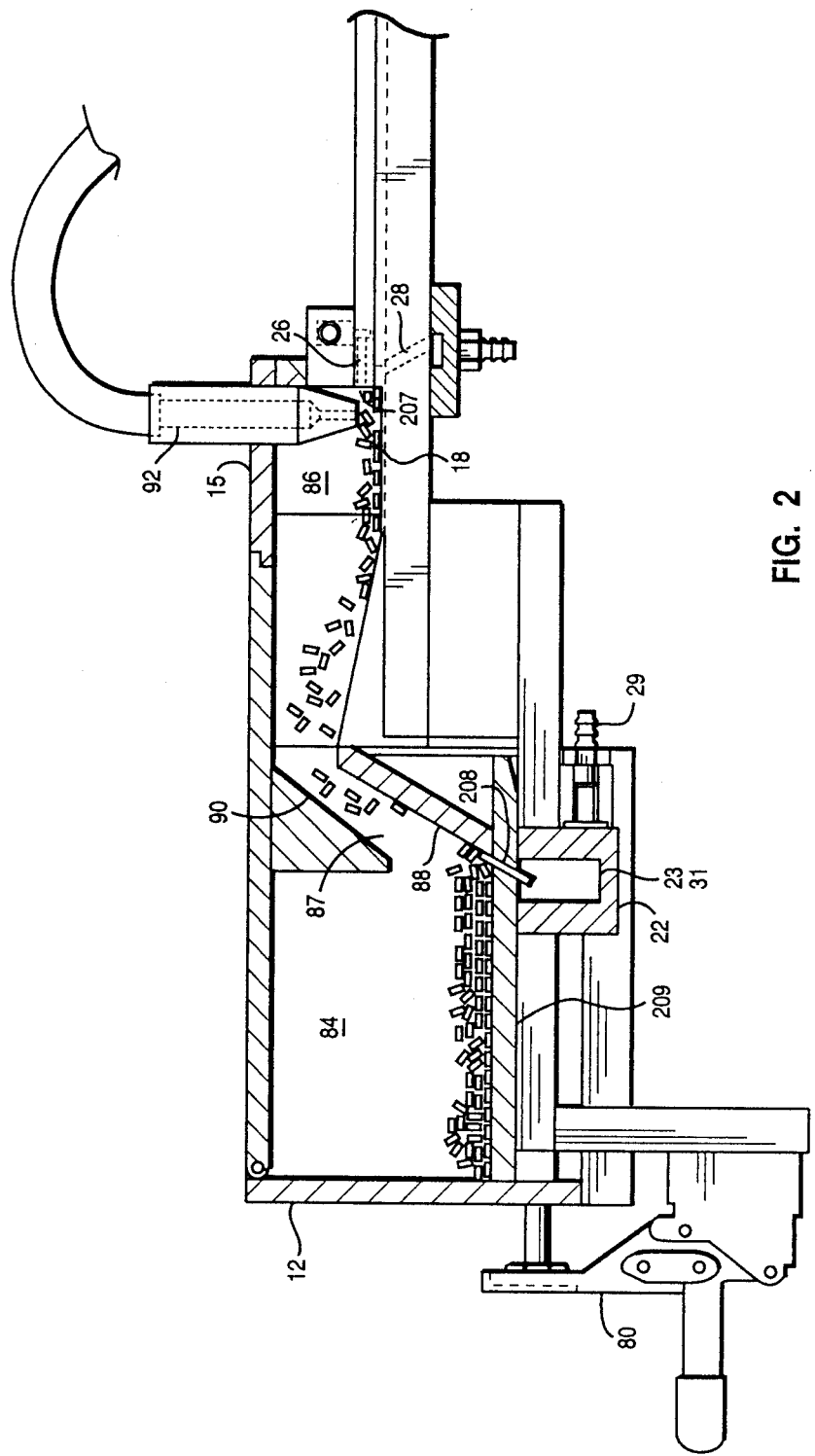
FIG. 2 is an elevational view of a portion of the component loader of FIG. 1 depicting chip movement from the hopper through the separator box to the upper portion of the track plate.
Figure 3:
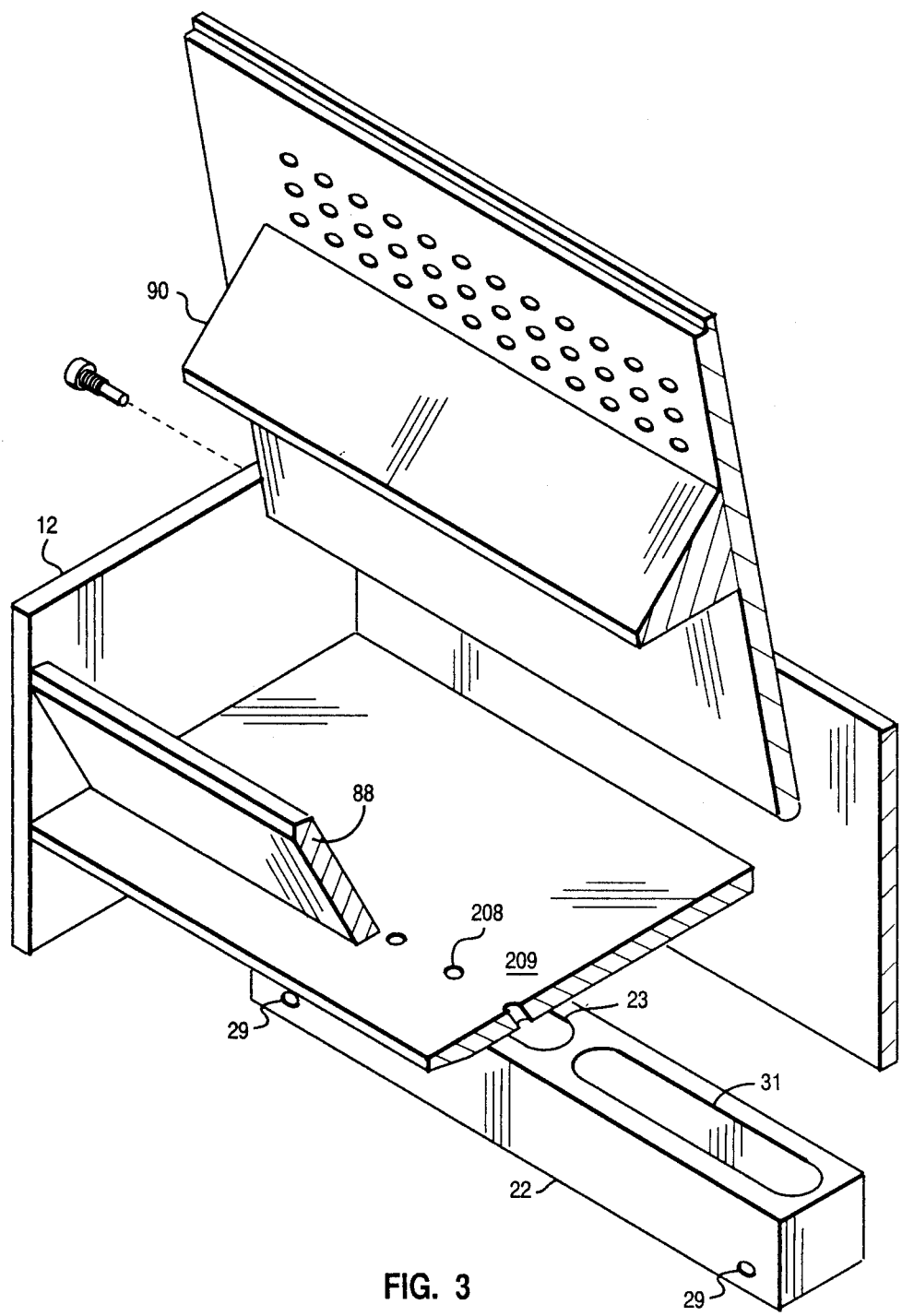
FIG. 3 is an exploded pictorial view of the chip supply box depicted in FIGS. 1 and 2.

Accordingly, each hopper 12 is provided with a manifold 22 defining two chambers 23 and 31, FIG. 3. Orifices 208 are disposed through the base 209 of each hopper 12 and are in fluid communication with respective ones of the chambers 23 and 31. It will be noted from FIG. 2 that such orifices 208 desirably extend at an angle relative to the vertical. A nozzle assembly 29 of any convenient means is carried by the hopper 12 whereby upon installation on the loader 12 the assembly is caused to matingly engage with spring-loaded quick disconnect air supply lines (not shown). Upon activation of supply lines, the pressurized air or other fluid is caused to enter the chambers 23 and 31 of the manifold 22 and thence to exit through orifices 208 into the cavity 84 of hopper 12. In this manner, chips contained in the cavity 84 are caused to travel upwards through chamber 87 formed by a plate 88 and deflector 90 and thence into the cavity 86 of the separator box 15.

With reference to FIG. 2, a plurality of apertures 26 and 28 are provided in the track plate 20, with the apertures 28 extending generally in the longitudinal direction of the plate 20, and the remaining apertures 26 extending at an angle relative to the axis of the apertures of 28. Periodically, as hereinafter described, these apertures 26–28 will be charged with pneumatic pressure which escapes in the direction of the throat 207, the purpose of which is to periodically clear the throat 207 of chip jams, thereby facilitating the orderly alignment of chips into the tracks 18 as is desired.

Figure 4:
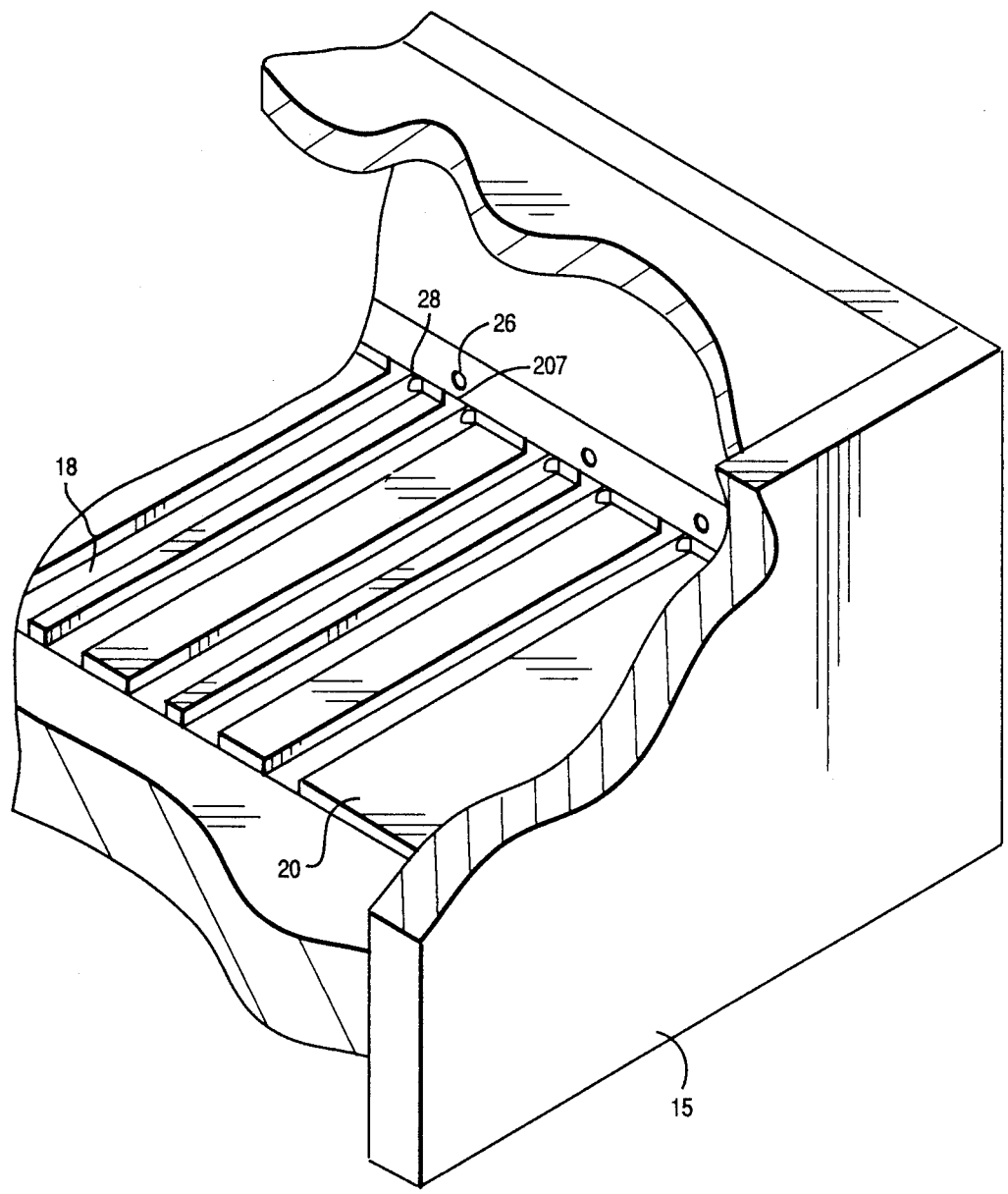
FIG. 4 is a view of the end of the track plate adjacent the separator box depicting the apertures for clearing the throat of the track plate.

Still referring to FIG. 2 an optical sensor assembly 92 or other suitable means is provided in the separator box 15 for detecting the magnitude of chips proximal to the throat 207 and the apertures 26 and 28, FIGS. 2, 4. Appropriate control circuitry, in response to the senor 92, causes periodic energization of the supply lines to the nozzle assembly 29 when an insufficient number of chips is detected by the sensor 92 thereby causing a next quantum of chips to enter the cavity 86 from hopper 12 in the hereinbefore described manner. In a typical operation of the herein described apparatus it has been found that the apertures 208 could be energized at a rate of 1 per 10 seconds and the apertures 26 and 28 energized at a rate of approximately two pulses per second in order to enhance throughput operation of the loader 10 (although these parameters may be adjusted as required for a particular application).

Regarding the pressures desired to be exerted in the apertures 208, 26, and 28, these parameters are a function of the particular application. In general however, the pressure exerted in the manifold 22 should be in an amount sufficient to transport chips from chamber 84 to chamber 86 in sufficient quantities to keep up with the throughput of the tube stuffing action nominally 80 psi. has appeared satisfactory in many embodiments. As to the desired pressure in the apertures 26 and 28, it will be appreciated that the main function of pressurized fluid exiting these apertures is, in the normal tube loading mode, not to urge chips out of the cavity 86 and back into the cavity 84 (as is the case in the purging operation previously described). On the contrary, the function of such air jets outwards of the apertures 26–28 toward the cavity 86 is simply to periodically clear the throat 207 adjacent these apertures from undue pileups of chips which has been found to adversely affect the desired operation of the loader 10 in orienting chips in a uniform manner along the lines defined by the que tracks 18. Accordingly, with respect to desired pressures to be introduced into apertures 26–28, it has been found that the pressure generally should be only in an amount sufficient to periodically clear chips from the throat area adjacent these apertures and back into the cavity 86, on the order of 50 psi.

Referring back to FIGS. 1a–c, a mechanism is provided for moving the loader 10 between the first and second operating positions shown in FIGS. 1b and 1c, respectively. In the first position, FIG. 1b, the loader is in a state suitable for storage or purging the system as previously described. However, the loader is positioned as shown in FIG. 1c when under operation with the track plate 20 in a 40° inclined angle so as to facilitate downward gravity feed and progress of the chips along the track plate into the tubes.

The mechanism for alternately positioning the apparatus as shown in FIGS. 1b and 1c includes a pneumatic cylinder 258 interconnected by bracket 260 to a mounting plate 262 on which the plate 25 is attached. A base plate 250 is provided for supporting the entire apparatus having a bracket 261 attached to the other end of the drive mechanism such as the cylinder 258. Additional brackets 252 and 256 are interconnected to respective plates 262 and 250 and have a hinged interconnection 254. By energizing the cylinder 258 in an appropriate manner, the shaft thereof will exert a force against connector 260 to raise the apparatus to the configuration of FIG. 1c. Alternatively, by reducing pressure in the cylinder 258 the apparatus will return to the static position shown in FIG. 1b.

The plunger assembly 46 will be described now in greater detail with reference to FIGS. 9a, 10-12. A manifold 132 defines a cavity 138 therein. Pendantly disposed therefrom are a plurality of cylinder assemblies 124, each being threadedly received by the manifold 132 and having an annulus 134 extending therethrough. The manifold is supported by a plunger block 120 having semi-circular grooves 122 machined therein which received the cylindrical assemblies 124. The assemblies are retained against the block 120 by a retainer bracket 126.

Each cylinder assembly 124 includes a rod 136 which slides along the longitudinal direction of the cylinder assembly 124 in response to fluid pressure in the cavity 138. Below each such rod 136 is a plunger 62 having a head slidably disposed in a plunger recess 128. Below the head 129 of each such plunger 62 is a spring 130 which provides an upward restorative force to the plunger 62 and rod 136. A comparison of FIGS. 11 and 12 will indicate the general purpose of the cylinder assembly 124. As shown in FIG. 11 prior to pneumatic energization of the manifold 132 and plunger assembly 124, the plungers 62 are in an upward position. When a chip is positioned at location 44 in a manner to be described, the manifold 132 is pressurized by means of a source of fluid pressure interconnected thereto forcing the rods 136 downwards which in turn force the plungers 62 downwards into the position shown in FIG. 12, thereby pushing a chip into tube 13.

Figure 6:
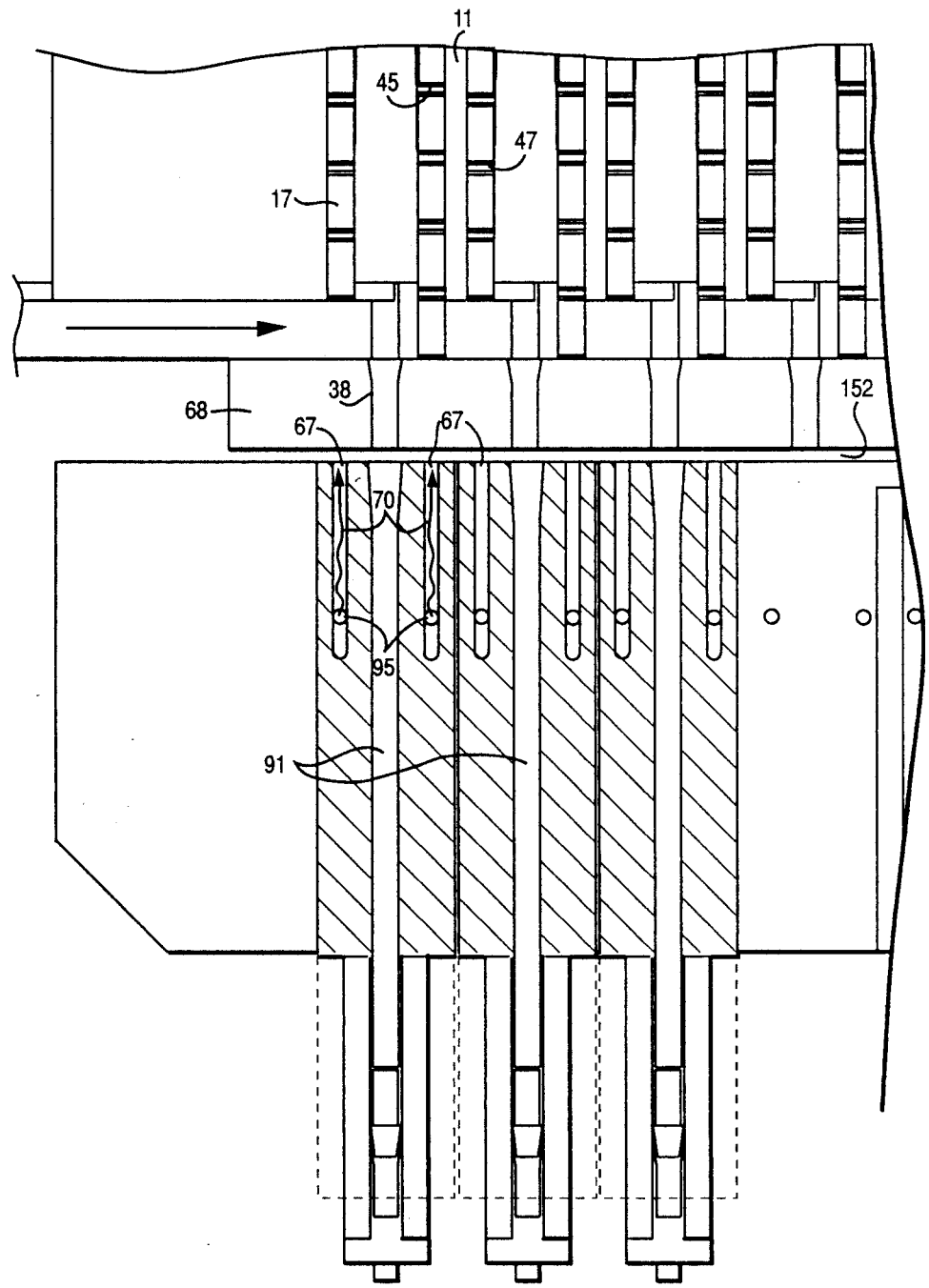
FIG. 6 is a top plan view, partly in section, of a section of the component loader of FIG. 1 adjacent the shuttle and plunger assembly depicting the shuttle in a first state of operation.
Figure 7:
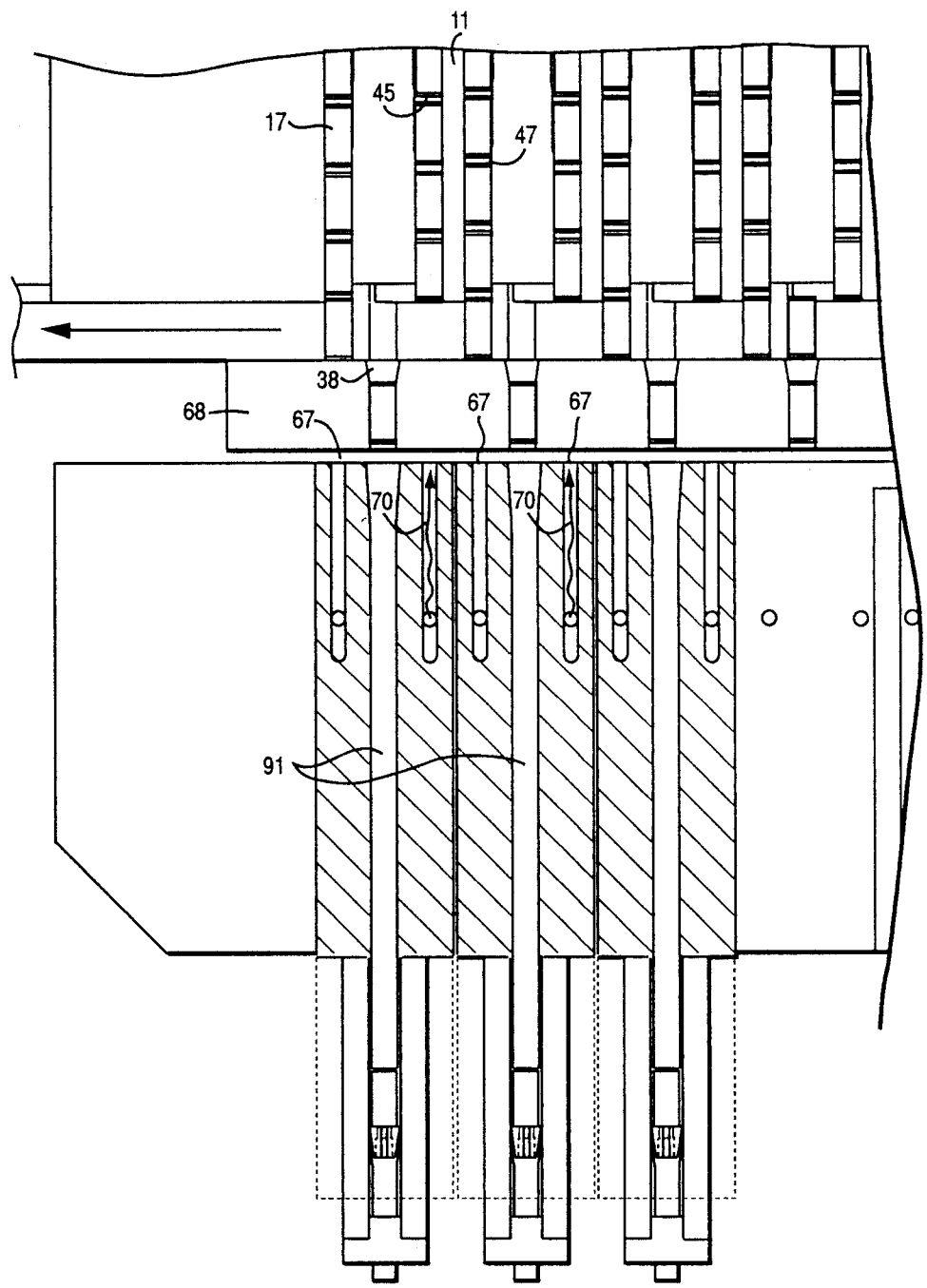
FIG. 7 is a top plan view of, partly in section, of the section of the loader illustrated in FIG. 6 depicting the shuttle in a second state of operation.

The manner in which the chips are moved along arrow 42, FIG. 11, to the location 44 will now be described. In FIG. 9a it will be noted that the plunger assembly 46 includes a plurality of tube retainers 110 each having disposed on the underneath side a ridge 114. Each ridge 114 is for slidably and retainedly receiving a corresponding one of the header blocks 64 carried by the magazine 14, each such header block in turn carrying one of the tubes 13. When a new set of tubes is desired to be filled by the apparatus, they are installed on the magazine 114 and the magazine is slid in the direction of arrow 116, FIG. 12 with the slots 71, FIG. 12 of each header block 64 sliding in mating engagement With the corresponding ridges 114 of each retainer 110 until the header blocks abuttingly engage the stops 118. A mounting block 108, FIG. 9a is provided which by means of screw holes 112 is fastened to the underneath side of the retainer 110. As depicted in FIG. 6, a groove 91 is cut in the underneath face of each block 93 (as well as the shorter grooves 67, FIG. 6, which, it will be recalled, were cut for purposes of receiving purging air which flows in the direction of arrow 70).

Thin tongues 150 coated with teflon or a similar material are disposed on the upper surface of the mounting block 108. It will be appreciated that with the mounting block 108 in assembly with the retainer 110, these tongues 150 will seal off the bottom portions of the grooves 67 and 91 to form chambers. By vibratory action the chips 17 will progress, after being individually selected by the shuttle mechanism, and be introduced into these grooves 91 by the previously described vibratory action, and will further progress towards the end of the retainers 110 to locations 44, FIG. 11, whereupon by means of the previously described action of the plunger assembly 46, the chips will be stuffed into their respective tubes 13.

It will be noted from FIGS. 6 and 14 that apertures 95 will extend upwards through these tongues 150 so as to provide fluid communication from the nozzle 79 through the mounting block 108, tongues 150, apertures 67, and track plate 20 for purging purposes as previously described. It will also be noted that a gap 152, FIG. 6, is provided to separate the vibratory motion associated with the track plate from the remainder of the plunger assembly 46. The chips actually will traverse along these upper teflon surfaces of these tongues 150 through the grooves 91 thereby insuring a smooth translation to the desired locations 44.

Figure 8:
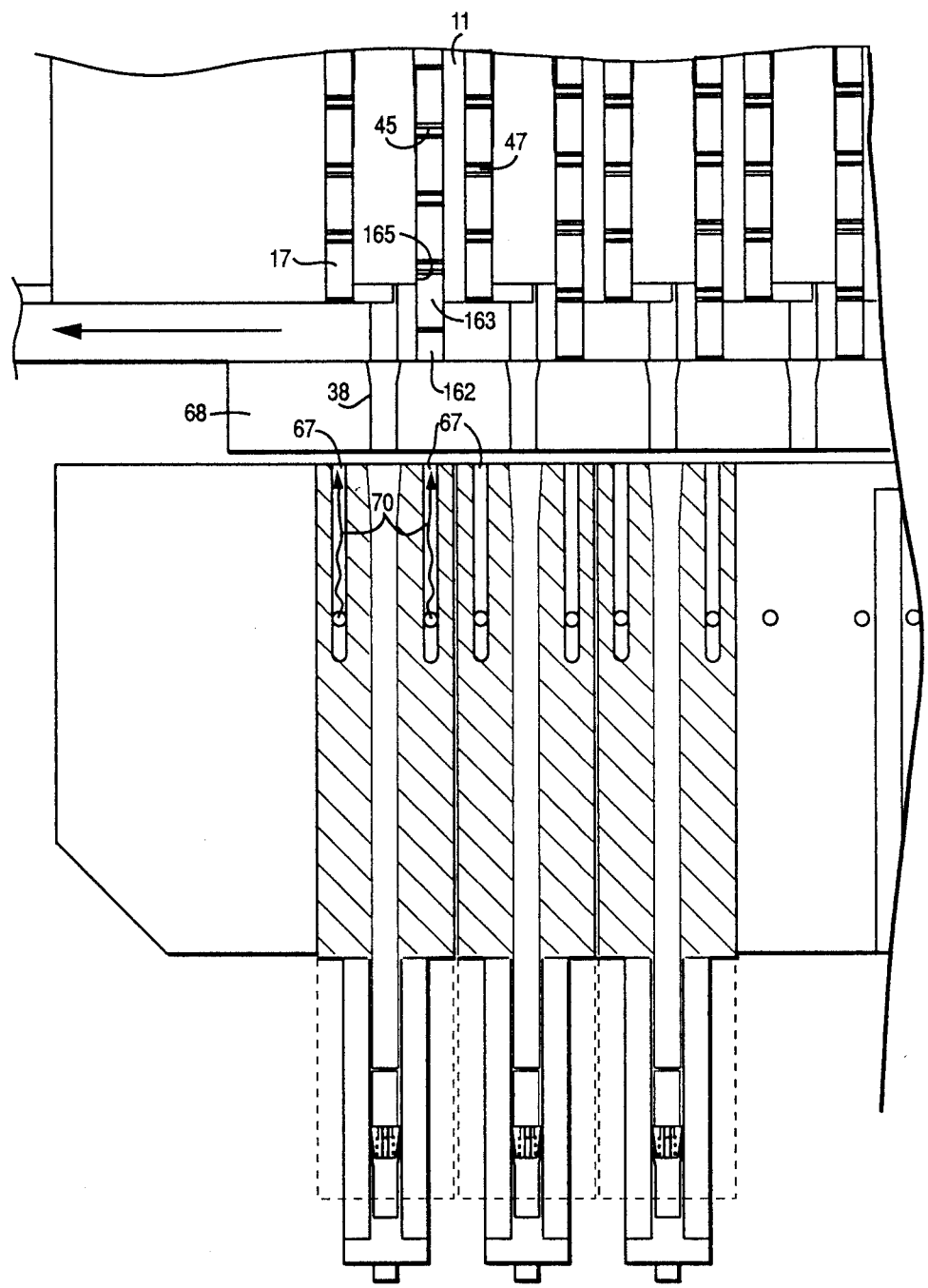
FIG. 8 is a plan view of, partly in section, of the section of the loader of FIG. 7 adjacent the shuttle and plunger assembly depicting the shuttle in a state wherein the shuttle is immobilized due to non-uniform chip lengths.

One function previously alluded to as being provided by the shuttling mechanism herein described is the automatic protection against undesirably loading chips of a non-uniform length into the tubes. As shown in FIGS. 8 when a chip having a length which does not conform with the desired length is introduced into the shuttle 32 (such non-uniformity being caused by broken chips, foreign matter, or the like), the shuttle is jammed, i.e., the hereinbefore described lateral motion between FIGS. 6–7 and FIGS. 9b–9f is prevented due to the chip 163 above the non-uniform chip 162 abutting against surface 165 thereby precluding further relative lateral motion between the shuttle plate and track plate. In this manner, the shuttle mechanism will be seen to serve desirably as a filter in a sense detecting by way of a shuttle jam the presence of a non-uniform chip, thereby precluding its being inadvertently and undesirably loaded into the tubes. By effecting the purging operation previously described, or otherwise by removing the chip 162 or other matter, the loading operation may hereafter resume.

Several additional test and control functions may desirably be added to the loader 10 which, although ancillary to the overall operation thereof, improve its utility. It will be recalled from the discussion of background art that it is highly desirable to consistently load a precise predetermined number of chips into each tube. Accordingly, it may be desirable to add a counter 170, FIG. 1a, which for example may count the reciprocating action of the shuttle 32 along the axis 37, FIG. 9a, thereby serving effectively to count the number of chips being loaded into the tubes. Alternatively, a number of other motion detectors or other transducers might be employed in the loader 10 at various locations as alternate ways to effect counting as, for example, by means of a motion detector and associated counter and control circuitry for sensing the periodic pneumatic energization of the annulus 134 of manifold 132, FIG. 11, or alternatively, for example, a counter means for sensing the periodic motions of the cylinder assemblies 124 or plunger 62.

Also, as discussed with reference to background art it will be recalled that due to the incredible throughput being provided with the advent of simultaneous component placement machines it has become important to insure uniformity of the electrical properties of each of the chips present in the tubes. Thus, if desired means may be provided for selectively testing the electrical properties of selected ones of the chips during the loading process. Accordingly, a chip tester module may be provided as desired for testing each chip which traverses a preselected one of the que tracks 18, such testing being effected as each chip of the preselected track traverses through the chip tester.

While the invention has been shown and described with reference to particular embodiments thereof, it will be understood by those skilled in the art that the foregoing and other changes in form and details may be made therein without departing from the spirit and scope of the invention.

What is claimed is:

1. Apparatus for loading electronic components into tubes carried by a tube magazine comprising queuing means for establishing a plurality of lines of said components disposed in uniform orientations; and plunger assembly means attached to the lower end of said queuing means for transferring said components off said lines into respective ones of said tubes.

2. The apparatus of claim 1 further including hopper means releasably interconnected to said queuing means for feeding said components randomly oriented therein to said queuing means.

3. The apparatus of claim 2 wherein said queuing means includes a throat; and pneumatic means for periodically clearing said components from said throat.

4. The apparatus of claim 3 wherein said queuing means further includes a track plate having a plurality of grooves for maintaining said components in said uniform orientations while moving along said grooves.

5. The apparatus of claim 4 wherein said queuing means further includes vibrator means for vibrating said components from said hopper means through said throat and into said grooves in said track plate.

6. The apparatus of claim 5 wherein a pair of said grooves are provided in said track plate for each said tube.

7. Apparatus for loading electronic components into tubes, comprising:
track plate means having a pair of grooves for each said tube for maintaining said components in lines while moving along said grooves.
queuing means for establishing a plurality of said lines of said components on said track plate means, including
a throat; and
vibrator means for vibrating said components through said throat and into said grooves on said track plate; and
a shuttle means for alternately selecting a component from each of said grooves of a given pair and aligning said selected component in a next line for placement in a respective one of said tubes;
plunger assembly means for transferring said components off said lines into respective ones of said tubes; and
pneumatic means for periodically clearing said components from said throat.

8. The apparatus of claim 24 wherein each of said components defines a uniform dimension taken along the direction of said lines; and wherein said shuttle means includes a shuttle plate having a width substantially equal to said uniform component dimension.

9. The apparatus of claim 8 wherein said shuttle means includes a funnel track.

10. The apparatus of claim 9 wherein said plunger assembly means includes a plurality of plunger means each corresponding to a different one of said tubes and a different one of said components when placed over said respective one of said tubes for moving said selected components from said next line into said respective tube.

11. The apparatus of claim 10 including magazine carrier means interconnected to said plunger assembly means for releasably attaching said tube magazine to said apparatus whereby said tubes are disposed adjacent respective ones of said plunger means for receiving said components.

12. The apparatus of claim 11 further including first pneumatic means for driving said components from said shuttle plate into said funnel tracks.

13. The apparatus of claim 12 wherein said hopper means includes a barrier dividing said hopper means into first and second chambers; and means for periodically regulating the relative proportion of said components when disposed in said hopper means in said first and second chambers.

14. The apparatus of claim 13 further including second pneumatic means for moving said components along said lines from said tubes towards said hopper means whereby said track plate is purged of said components.

15. A method for loading electronic components into carrier tubes carried by a tube magazine comprising
containing a plurality of said components in random orientations;
agitating said components from said contained random orientations until said components form into a plurality of lines; and
transferring said components from said lines into respective ones of said tubes.

16. The method of claim 15 wherein said agitating step further includes periodically moving said randomly oriented components away from said lines prior to said components forming portions of said lines.

17. The method of claim 16 further including vibrating said components along said lines downwardly toward said tubes.

18. A method for loading electronic components into tubes comprising:
containing a plurality of said components in random orientations;
agitating said components into a plurality of lines;
periodically moving said randomly oriented components away from said lines prior to said components forming portions of said lines;
vibrating said components along said lines downwardly toward said tubes; and
alternately urging a component from each of a pair of said lines into a respective one of said tubes.

19. The method of claim 25 wherein said transferring step further comprises
releasably positioning said tubes adjacent respective ones of said second lines; and
urging said components while forming a part of said second lines in a direction transverse to said lines into respective ones of said tubes.

20. The method of claim 19 wherein with respect to each said line pair said components are alternately moved from each line of said each pair transversely into a respective one of said second lines.

21. The method of claim 20 further including pneumatically urging said components along said second lines while forming said parts of said second lines.

22. The method of claim 21 wherein said component supporting step includes supporting said components in a releasable hopper defining first and second chambers; and periodically pneumatically regulating the relative proportion of said components when disposed in said hopper in said first and second chambers.

23. The method of claim 22 further including the step of periodically moving said components along said lines from said tubes toward said hopper until said components forming said lines are returned to said hopper.

* * * * *

UNITED STATES PATENT AND TRADEMARK OFFICE
CERTIFICATE OF CORRECTION

PATENT NO. : 4,974,390

DATED : December 4, 1990

INVENTOR(S) : Elmer J. Gill, Ronald E. Hunt and Verlon E. Whitehead

It is certified that error appears in the above-identified patent and that said Letters Patent is hereby corrected as shown below:

Col. 12, line 53, please delete "25" and insert --18--.

Signed and Sealed this

Twenty-eighth Day of July, 1992

Attest:

DOUGLAS B. COMER

*Attesting Officer*    Acting Commissioner of Patents and Trademarks